United States Patent
Halbert et al.

(10) Patent No.: US 6,928,593 B1
(45) Date of Patent: Aug. 9, 2005

(54) MEMORY MODULE AND MEMORY COMPONENT BUILT-IN SELF TEST

(75) Inventors: John Halbert, Beaverton, OR (US); Randy M. Bonella, Portland, OR (US)

(73) Assignee: Intel Corporation, Santa Clara, CA (US)

(*) Notice: Subject to any disclaimer, the term of this patent is extended or adjusted under 35 U.S.C. 154(b) by 755 days.

(21) Appl. No.: 09/664,910

(22) Filed: Sep. 18, 2000

(51) Int. Cl.[7] ............................................. G11C 29/00
(52) U.S. Cl. ........................ 714/718; 714/735; 365/201
(58) Field of Search ................................ 714/735, 718, 714/726; 365/201, 51; 710/13

(56) References Cited

U.S. PATENT DOCUMENTS

| | | | |
|---|---|---|---|
| 4,837,785 A | * 6/1989 | McAlpine | ..................... 370/85 |
| RE34,445 E | 11/1993 | Hayes et al. | |
| 5,613,153 A | 3/1997 | Arimilli et al. | |
| 5,633,878 A | * 5/1997 | Ernkell et al. | ................. 371/24 |
| 5,638,382 A | * 6/1997 | Krick et al. | ............... 371/22.5 |
| 5,748,640 A | 5/1998 | Jiang et al. | |
| 5,815,427 A | * 9/1998 | Cloud et al. | ................... 365/51 |
| 5,835,936 A | * 11/1998 | Tomioka et al. | ............. 711/103 |
| 5,883,843 A | * 3/1999 | Hii et al. | ..................... 365/201 |
| 5,946,247 A | * 8/1999 | Osawa et al. | ................ 365/201 |
| 5,961,653 A | 10/1999 | Kalter et al. | |
| 5,982,681 A | 11/1999 | Schwarz | |
| 6,019,501 A | * 2/2000 | Okazaki | ..................... 371/21.1 |
| 6,058,056 A | * 5/2000 | Beffa et al. | .................. 365/201 |
| 6,182,257 B1 | 1/2001 | Gillingham | |
| 6,247,070 B1 | * 6/2001 | Ryan | ........................... 710/13 |
| 6,415,403 B1 | * 7/2002 | Huang et al. | ................ 714/726 |
| 6,477,674 B1 | * 11/2002 | Bates et al. | .................. 714/738 |
| 2001/0014925 A1 | 8/2001 | Kumata | |

OTHER PUBLICATIONS

A 72K CMOS Channelless Gate Array with Embedded 1Mbit Dynamic RAM, Kazuhiro Sawada, et al., pp. 20.3.1–20.3.4.

* cited by examiner

Primary Examiner—Albert Decady
Assistant Examiner—Dipakkumar Gandhi
(74) Attorney, Agent, or Firm—Pillsbury Winthrop LLP

(57) ABSTRACT

A memory component with built-in self test includes a memory array. An input/output interface is coupled to the memory array and has a loopback. A controller is provided to transmit memory array test data to the memory array to store the memory array test data, and to read the memory array test data from the memory array. A compare register is also provided to compare the memory array test data transmitted to the memory array with the memory array test data read from the memory array.

64 Claims, 2 Drawing Sheets

MEMORY MODULE AND MEMORY COMPONENT BUILT-IN SELF TEST

BACKGROUND OF THE INVENTION

1. Field of the Invention

The present invention relates generally to memory systems, and more specifically, to memory modules and memory components, such as a memory device or a memory buffer, having built-in self test functionality.

2. Discussion of the Related Art

Integrated circuit devices such as random access memories (RAMs) usually undergo device verification testing during manufacture. Typically, such verification tests are designed to detect both static and dynamic defects in a memory array. Static defects include, for example, open circuit and short circuit defects in the integrated circuit device. Dynamic defects include defects such as weak pull-up or pull-down transistors that create timing sensitive defects.

A specialized integrated circuit device tester is normally employed to perform manufacturing verification tests. For example, such an integrated circuit device tester may be used to perform read/write verification cycle tests on the memory array. Relatively low-speed (e.g., 20 MHz), low-cost integrated circuit device testers are usually sufficient for detecting static defects in the memory array. However, extremely expensive integrated device testers are needed to detect dynamic defects in very high-speed memory arrays. Such expensive high-speed integrated circuit testers increase the overall manufacturing costs for such devices. In addition, for integrated circuit devices that include large memory arrays, the cycle time required to perform such read/write tests increases in proportion to the size of the array.

Attempts to overcome some of the difficulties associated with testing integrated circuit devices have included implementing built-in self-test (BIST) circuitry. For example, an integrated circuit cache memory array may contain circuitry to perform a standard static random access memory (SRAM) 13N March test algorithm on the memory array. A state machine is typically used to generate the 13N March test algorithm along with circuitry to sample data output and to generate a signature of the results. The signature is then compared against an expected value to determine whether defects exist in the memory array. Such BIST circuitry usually enables high-speed testing while obviating expensive high-speed testers.

Unfortunately, these BIST routines have generally only been able to apply a preprogrammed test sequence on the memory array. As the process of manufacturing such a memory array evolves, manufacturing test engineers typically develop improved strategies for detecting both static and dynamic defects in the memory array.

Moreover, such improved strategies for detecting defects can only be applied to testing that occurs while the device is placed in an expensive integrated circuit device tester. Therefore, engineers have been unable to achieve the benefits of improved test strategies without the use of an expensive tester, or without redesigning the integrated circuit device. Because of the advances in memory technology, and particularly in the area of narrow high-speed buses, which typically run at speeds of about 1.6 GHz, for use with dynamic random access memory devices (DRAMs), it is very expensive to obtain a high-speed tester capable of testing a memory module or a memory component at such high operating frequencies. Therefore, the added use of expensive high-speed hardware testers increases the time required to ascertain hardware failures, not to mention greatly increasing the overall manufacturing cost of these memory modules and memory components.

DETAILED DESCRIPTION

Figure 1:
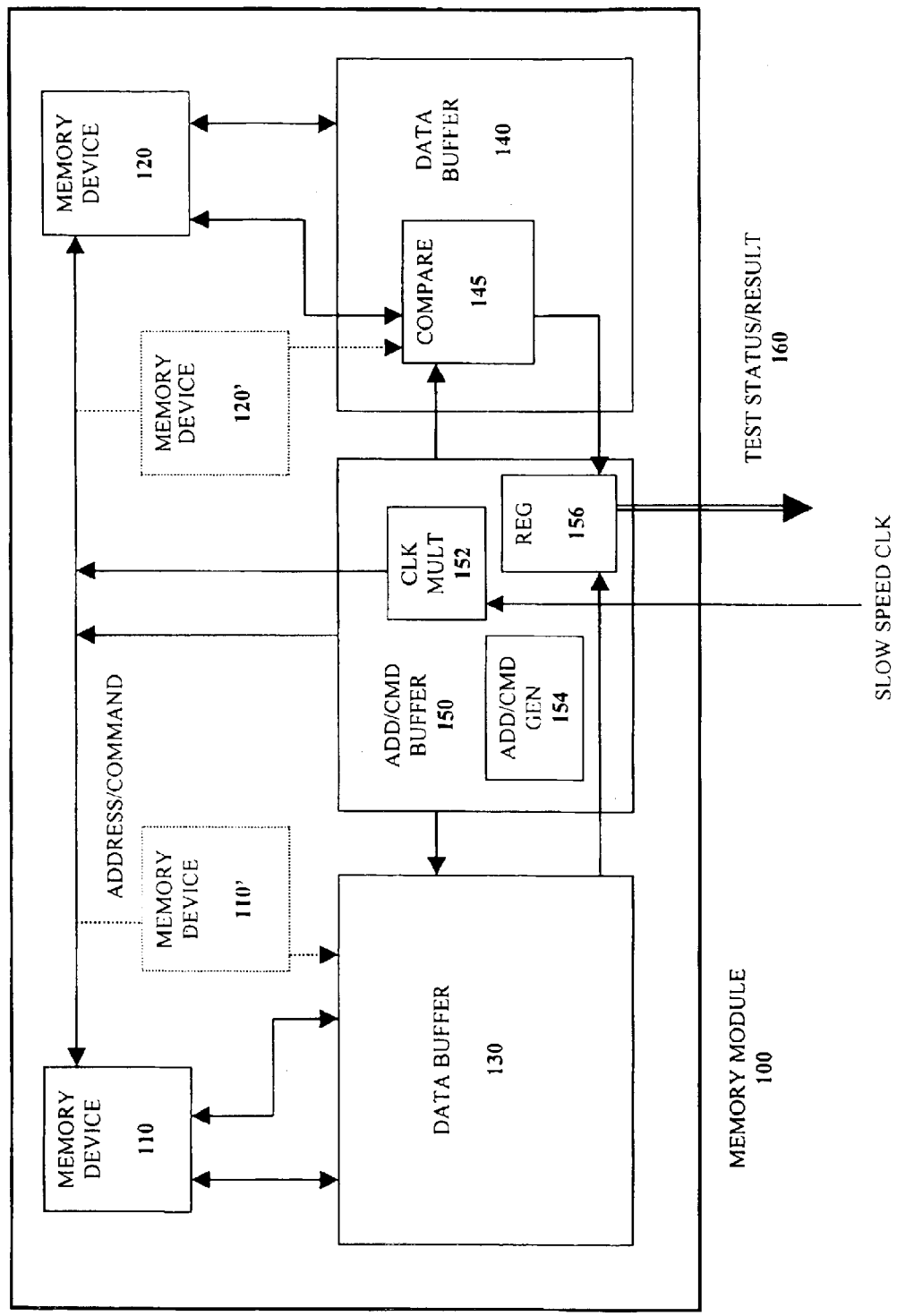
FIG. 1 illustrates a memory module having built-in self test according to an embodiment of the present invention.

FIG. 1 illustrates a memory module having built-in self test (BIST) according to an embodiment of the present invention. By utilizing the memory module 100 of FIG. 1, an expensive external high-speed tester is not required to test the memory module 100. The memory module 100 is configured so as to utilize BIST without any external equipment.

The memory module 100 shown in FIG. 1 utilizes a set of buffers 130, 140, 150 in order to provide an interface with a processor component, such as a memory controller (not shown), which may be operating at a different voltage and/or frequency than the memory devices 110, 120, such as dynamic random access memory (DRAM) devices. In the embodiment of FIG. 1, a three-buffer configuration is utilized for the memory module 100: two data buffers $1^{st}$ 130, $2^{nd}$ 140, and an address and command buffer 150. However, the $1^{st}$ and $2^{nd}$ data buffers 130, 140 and the address and command buffer 150 may be incorporated into a single buffer device, or additional buffer components may be utilized as well.

In one embodiment, the built-in self test (BIST) logic and circuitry are incorporated with the address and command buffer 150. The address and command buffer preferably includes an address and command generator 154 to generate the address and commands and the test data to be transmitted to the memory devices 110, 120 for testing. However, instead of generating the test data, the BIST logic may utilize existing data extracted from the memory controller off of the data bus as the test data as well. Along with generating the test data, the address and command generator 154 also generates compare test data, which is used to compare the test data read from the memory devices 110, 120 with the test data (which is identical to the compare test data) initially transmitted from the address/command generator 154 to the memory devices 110,120 for storage.

In one embodiment, the test data generated by the address/command generator 154 is transmitted to the memory devices 110, 120 for storage therein. Then, the test data stored (written) in the memory devices 110, 120 are read from the memory devices 110, 120 and compared with the compare test data, which is identical to the test data, also generated by the address/command generator 154. A comparator 145, such as an "exclusive OR" (XOR) comparator, may be provided in each one of the data buffers 130,140 to compare the test data read from the memory devices 110, 120 with the compare test data provided by the address/command generator 154. A determination of whether the comparison is a match or a failure is made by the comparator 145, and a result then is preferably transmitted to a test result/status register 156, that may be provided within the address and command buffer 150. The test result/status register 156 may then provide a test status or result signal to an external device, such as a memory controller. The test status/result signal generated by the test result/status register 156 may utilize a two-bit packet, indicating, for example, the following states: BIST not enabled (00); BIST executing (01); BIST failed (10); and BIST passed (11). Although FIG. 1 illustrates a memory module 100 having two memory devices 110, 120, the memory module 100 is not limited to only two memory devices, and any suitable number may be used.

Additionally, rather than using a high-speed clock signal to perform testing, the memory module 100 may use a slow speed clock signal, generating just one clock, and using a clock multiplier 152 within the address and command buffer 150 to multiply and distribute the clock signal to the memory devices 110, 120. Accordingly, by utilizing the memory module 100 illustrated in FIG. 1, the memory module 100 may be tested independently of other systems, and expensive high-speed testers are not required to test the memory devices 110,120 and their connections within the memory module 100 itself.

Figure 2:
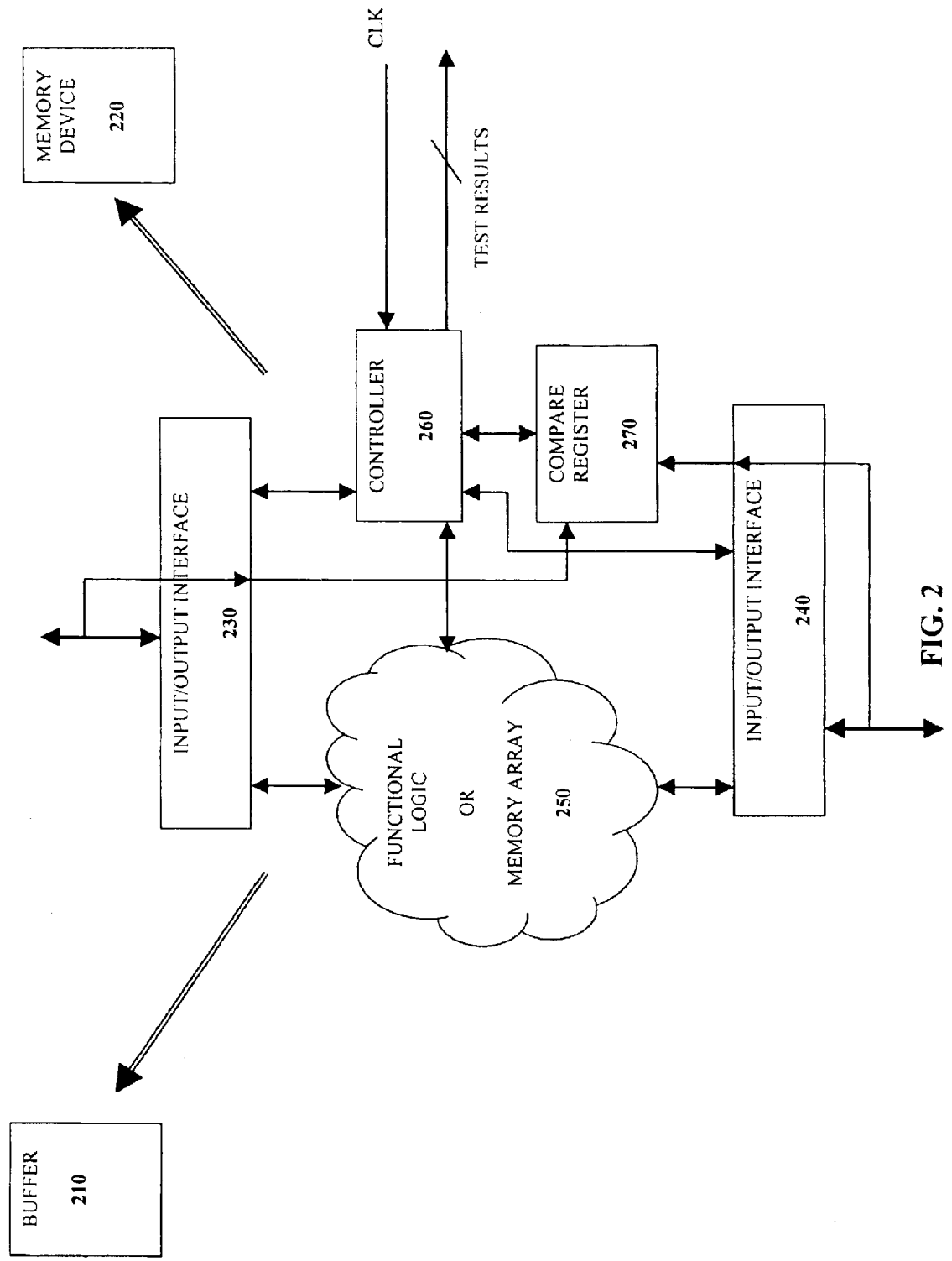
FIG. 2 illustrates a memory component having built-in self test according to an embodiment of the present invention.

FIG. 2 illustrates a memory component having BIST according to an embodiment of the present invention. As illustrated in FIG. 2, BIST logic may be provided completely within a single memory component, such as a buffer 210 and a memory device 220. That is, each memory component may be taken independently of any other component and tested on its own. The buffer 210 may be an address and command buffer 150, or a data buffer 130, 140, as discussed above with respect to FIG. 1.

The BIST logic includes a controller 260 to perform the BIST operations. The controller 260 preferably receives a clock signal, and also provides test result signals from the memory component, such as a buffer 210 or a memory device 220. The controller 260, like the address and command generator 154 of FIG. 1, is adapted to generate test data and compare test data to test the functional logic or memory array 250 (depending on the type of memory component, e.g., a buffer or memory device) of the buffer component 210, or memory device 220. The test data is preferably provided to the functional logic or memory array 250, which is then transmitted to an input/output interface 230, 240. The test data may also be transmitted directly to the input/output interface 230, 240 from the controller 260 to test the input/output interface 230, 240.

The input/output interface 230, 240 is configured with a loopback so that the test data may be directed back from an input/output connection to a compare register 270 to compare the test data from the input/output interface 230, 240, and ultimately, the functional logic or memory array 250. The controller 260 is adapted to generate and provide compare test data to the compare register 270 so that the compare register 270 may compare the test data received from the input/output interface 230, 240 with the compare test data to determine whether there was a match, and whether the test was successful. Accordingly, the compare register 270 makes a determination regarding the results of the test, and the test results are reported, preferably by the controller 260. The compare register 270 and the controller 260 may be embodied within a single device or a common circuit.

Therefore, by having memory components such as a buffer 210 and a memory device 220 with BIST, localized self-testing may be performed after the buffer 210 and the memory device 220 is manufactured. However, component-level built-in self test may be performed at various stages of manufacture and packaging, including at the wafer probe stage, during post-packaging, and even during post-assembly. Accordingly, the memory components 210, 220 of FIG. 2 may be tested independently of other components, and expensive high-speed testers are not required to test the memory components 210, 220.

While the description above refers to particular embodiments of the present invention, it will be understood that many modifications may be made without departing from the spirit thereof. The accompanying claims are intended to cover such modifications as would fall within the true scope and spirit of the present invention. The presently disclosed embodiments are therefore to be considered in all respects as illustrative and not restrictive, the scope of the invention being indicated by the appended claims, rather than the foregoing description, and all changes that come within the meaning and range of equivalency of the claims are therefore intended to be embraced therein.

What is claimed is:

1. A memory component with built-in self test, comprising:
    an input/output interface having a loopback;
    a controller to transmit input/output test data to the input/output interface, and to receive the input/output test data from the loopback of the input/output interface; and
    a compare register to store and compare the input/output test data transmitted to the input/output interface with the input/output test data received from the input/output interface, wherein the memory component resides within a memory module having a plurality of memory devices and at least one buffer.

2. The memory component according to claim 1, wherein the memory component is a dynamic random access memory (DRAM).

3. The memory component according to claim 1, wherein the memory component is a buffer.

4. The memory component according to claim 3, wherein the buffer is an address and command buffer.

5. The memory component according to claim 3, wherein the buffer is a data buffer.

6. The memory component according to claim 3, wherein the buffer is an address and command and data buffer.

7. The memory component according to claim 1, wherein the compare register generates a test result based on the input/output test data transmitted to the input/output interface compared with the input/output test data received from the input/output interface.

8. The memory component according to claim 1, wherein the controller is adapted to transmit memory array test data to a memory array to store the test data therein, and to read the memory array test data from the memory array, and the compare register is adapted to compare the memory array test data transmitted to the memory array with the memory array test data read from the memory array.

9. A memory component with built-in self test, comprising:
    a memory array;
    an input/output interface coupled to the memory array and having a loopback;
    a controller to transmit memory array test data to the memory array to store the memory array test data, and to read the memory array test data from the memory array; and
    a compare register to store and compare the memory array test data transmitted to the memory array with the memory array test data read from the memory array, wherein the memory component resides within a memory module having a plurality of memory devices and at least one buffer.

10. The memory component according to claim 9, wherein the memory component is a dynamic random access memory (DRAM).

11. The memory component according to claim 9, wherein the memory component is a buffer.

12. The memory component according to claim 11, wherein the buffer is an address and command buffer.

13. The memory component according to claim 11, wherein the buffer is a data buffer.

14. The memory component according to claim 11, wherein the buffer is an address and command and data buffer.

15. The memory component according to claim 9, wherein the compare register generates a test result based on the memory array test data transmitted to the memory array compared with the memory array test data read from the memory array.

16. A method of testing a memory component with built-in self test, comprising:
    transmitting input/output test data to an input/output interface having a loopback;
    receiving the input/output test data from the loopback of the input/output interface;
    storing the input/output test data transmitted to the input/output interface and the input/output test data received from the input/output interface in a register; and
    comparing the input/output test data transmitted to the input/output interface with the input/output test data received from the input/output interface, wherein the memory component resides within a memory module having a plurality of memory devices and at least one buffer.

17. The method according to claim 16, wherein the memory component is a dynamic random access memory (DRAM).

18. The method according to claim 16, wherein the memory component is a buffer.

19. The method according to claim 18, wherein the buffer is an address and command buffer.

20. The method according to claim 18, wherein the buffer is a data buffer.

21. The method according to claim 18, wherein the buffer is an address and command and data buffer.

22. The method according to claim 18, wherein the buffer is an address and command buffer.

23. The method according to claim 18, wherein the buffer is a data buffer.

24. The method according to claim 18, wherein the buffer is an address and command and data buffer.

25. The method according to claim 16, wherein the compare register generates a test result based on the input/output test data transmitted to the input/output interface compared with the input/output test data received from the input/output interface.

26. The method according to claim 16, further including:
    transmitting memory array test data to a memory array;
    storing the memory array test data in the memory array;
    reading the memory array test data from the memory array; and
    comparing the memory array test data transmitted to the memory array with the memory array test data read from the memory array.

27. The method according to claim 24, wherein the memory component is a dynamic random access memory (DRAM).

28. The method according to claim 24, wherein the memory component is a buffer.

29. A method of testing a memory component with built-in self test, comprising:
    transmitting memory array test data to a memory array;
    storing the memory array test data in the memory array;
    reading the memory array test data from the memory array;
    storing the memory array test data transmitted to the memory array and the memory array test data read from the memory array in a register; and
    comparing the memory array test data transmitted to the memory array with the memory array test data read from the memory array, wherein the memory component resides within a memory module having a plurality of memory devices and at least one buffer.

30. The method according to claim 29, wherein the memory component is a dynamic random access memory (DRAM).

31. The method according to claim 29, wherein the memory component is a buffer.

32. The method according to claim 31, wherein the buffer is an address and command buffer.

33. The method according to claim 31, wherein the buffer is a data buffer.

34. The method according to claim 31, wherein the buffer is an address and command and data buffer.

35. The method according to claim 29, wherein the compare register generates a test result based on the memory array test data transmitted to the memory array compared with the memory array test data read from the memory array.

36. A memory module with built-in self test, comprising:
    a plurality of memory components;
    an address and command buffer adapted to transmit address and command data and test data to one of the plurality of memory components, wherein the address and command buffer includes a register to receive a test result; and
    at least one data buffer to receive the test data from the address and command buffer, to receive the test data from the one of the plurality of memory components, and to compare the test data received from the address and command buffer with the test data received from the one of the plurality of memory components to generate the test result, wherein the plurality of memory components, the address and command buffer, and the at least one data buffer all reside within the memory module.

37. The memory module according to claim 36, wherein the address and command buffer and the data buffer are within a single buffer chip.

38. The memory module according to claim 36, wherein the at least one memory component is a dynamic random access memory (DRAM).

39. The memory module according to claim 36, wherein the address and command buffer includes a clock multiplier to receive a clock signal and to multiply the clock signal for transmission to the at least one memory component and the at least one data buffer.

40. The memory module according to claim 36, wherein the address and command buffer includes an address and command generator to generate the address and command data.

41. The memory module according to claim 36, wherein the test data is obtained from a data bus through a memory controller.

42. The memory module according to claim 36, wherein the register receives the test result from the at least one data buffer and reports the test result as one of the following conditions: built-in self test not enabled, built-in self test enabled, built-in self test failed, and built-in self test passed.

43. The memory module according to claim 36, wherein the at least one data buffer utilizes an exclusive-OR (XOR) comparator to compare the test data received from the address and command buffer with the test data received from the at least one memory component.

44. A method of testing a memory module with built-in self test, the method comprising:
  transmitting address and command data and test data to a memory component among a plurality of memory components from an address and command buffer, wherein the plurality of memory components and the address and command buffer all reside within the memory module;
  receiving the test data from the address and command buffer;
  receiving the test data from the memory component; and
  comparing the test data received from the address and command buffer with the test data received from the memory component to generate a test result.

45. The method according to claim 44, wherein receiving the test data from the address and command buffer, receiving the test data from the memory component, and comparing the test data are performed in a data buffer.

46. The method according to claim 45, wherein the data buffer and the address and command buffer are within a single buffer chip.

47. The method according to claim 44, wherein the memory component is a dynamic random access memory (DRAM).

48. The method according to claim 44, further including:
  receiving a clock signal by a clock multiplier of the address and command buffer;
  multiplying the clock signal; and
  transmitting the clock signal to the memory component and a data buffer.

49. The method according to claim 44, further including:
  generating the address and command data from an address and command data generator of the address and command buffer.

50. The method according to claim 44, further including:
  obtaining the test data from a data bus through a memory controller.

51. The method according to claim 44, further including:
  receiving the test result in a register of the address and command buffer; and
  reporting the test result from the register as one of the following conditions: built-in self test not enabled, built-in self test enabled, built-in self test failed, and built-in self test passed.

52. The method according to claim 44, wherein comparing the test data received from the address and command buffer with the test data received from the memory component is performed by a data buffer utilizing an exclusive-OR (XOR) comparator.

53. A memory module with built-in self test, comprising:
  a plurality of memory components;
  an address and command buffer adapted to transmit address and command data and test data to one of the plurality of memory components, wherein the address and command buffer includes,
    a register to receive a test result,
    a clock multiplier to receive a clock signal and to multiply the clock signal for transmission, and
    an address and command generator to generate the address and command data; and
  at least one data buffer to receive the test data from the address and command buffer, to receive the test data from the one of the plurality of memory components, and to compare the test data received from the address and command buffer with the test data received from the one of the plurality of memory components to generate the test result, wherein the plurality of memory components, the address and command buffer, and the at least one data buffer all reside within the memory module.

54. The memory module according to claim 53, wherein the address and command buffer and the data buffer are within a single buffer chip.

55. The memory module according to claim 53, wherein the at least one memory component is a dynamic random access memory (DRAM).

56. The memory module according to claim 53, wherein the test data is obtained from a data bus through a memory controller.

57. The memory module according to claim 53, wherein the register receives the test result from the at least one data buffer and reports the test result as one of the following conditions: built-in self test not enabled, built-in self test enabled, built-in self test failed, and built-in self test passed.

58. The memory module according to claim 53, wherein the at least one data buffer utilizes an exclusive-OR (XOR) comparator to compare the test data received from the address and command buffer with the test data received from the at least one memory component.

59. A memory component with built-in self test, comprising:
  a memory array;
  an input/output interface coupled to the memory array and having a loopback;
  a controller to transmit memory array and test data to the memory array to store the memory array test data, to read the memory array test data from the memory array, to receive the memory array test data from the loopback of the input/output interface that was transmitted by the memory array to the input/output interface, to transmit input/output test data to the input/output interface, and to receive the input/output test data from the loopback of the input/output interface; and
  a compare register to store and compare the memory array test data transmitted to the memory array with the memory array test data read from the memory array, to store and compare the memory array test data transmitted to the memory array with the memory array test data received from the loopback of the input/output interface that was transmitted from the memory array, and to store and compare the input/output test data transmitted to the input/output interface with the input/output test data received from the loopback of the input/output interface, wherein the compare register generates a test result based on the memory array test data transmitted to the memory array compared with the memory array test data read from the memory array, generates a test result based on the memory array test data transmitted to the memory array compared with the memory array test data received from the loopback of the input/output interface that was transmitted by the memory array to the input/output interface, and generates a test result based on the input/output test data transmitted to the input/output interface compared with the input/output test data received from the loopback of the input/output interface.

60. The memory component according to claim 59, wherein the memory component is a dynamic random access memory (DRAM).

61. The memory component according to claim 59, wherein the memory component is a buffer.

62. The memory component according to claim 61, wherein the buffer is an address and command buffer.

63. The memory component according to claim 61, wherein the buffer is a data buffer.

64. A method of testing a memory component with built-in self test, comprising:

transmitting memory array test data to a memory array to store the memory array test data;

reading the memory array test data from the memory array;

receiving the memory array test data from a loopback of an input/output interface that was transmitted by the memory array to the input/output interface;

transmitting input/output test data to the input/output interface;

receiving the input/output test data from the loopback of the input/output interface;

storing and comparing the memory array test data transmitted to the memory array with the memory array test data read from the memory array;

storing and comparing the memory array test data transmitted to the memory array with the memory array test data received from the loopback of the input/output interface that was transmitted from the memory array;

storing and comparing the input/output test data transmitted to the input/output interface with the input/output test data received from the loopback of the input/output interface;

generating a test result based on the memory array test data transmitted to the memory array compared with the memory array test data read from the memory array;

generating a test result based on the memory array test data transmitted to the memory array compared with the memory array test data received from the loopback of the input/output interface that was transmitted by the memory array to the input/output interface; and generating a test result based on the input/output test data transmitted to the input/output interface compared with the input/output test data received from the loopback of the input/output interface.

* * * * *